:

US009478462B1

(12) United States Patent
Wang et al.

(10) Patent No.: US 9,478,462 B1
(45) Date of Patent: Oct. 25, 2016

(54) SAV USING SELECTIVE SAQP/SADP

(71) Applicant: GLOBALFOUNDRIES Inc., Grand Cayman (KY)

(72) Inventors: Wenhui Wang, San Jose, CA (US); Ryan Ryoung-han Kim, Albany, NY (US); Lei Sun, Albany, NY (US); Erik Verduijn, Rensselaer, NY (US); Yulu Chen, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/071,255

(22) Filed: Mar. 16, 2016

(51) Int. Cl.
*H01L 21/768* (2006.01)
*H01L 21/306* (2006.01)
*H01L 21/311* (2006.01)
*H01L 23/528* (2006.01)
*H01L 23/532* (2006.01)

(52) U.S. Cl.
CPC ... *H01L 21/76897* (2013.01); *H01L 21/30604* (2013.01); *H01L 21/31111* (2013.01); *H01L 21/76816* (2013.01); *H01L 23/528* (2013.01); *H01L 23/5329* (2013.01)

(58) Field of Classification Search
CPC ............. H01L 21/76897; H01L 21/76816; H01L 23/528
See application file for complete search history.

(56) References Cited

U.S. PATENT DOCUMENTS 8,298,943 B1 * 10/2012 Arnold ............... H01L 21/0337
438/667

OTHER PUBLICATIONS

Kim et al. "Method for Producing Self-Aligned Vias" filed on Mar. 16, 2016, entire prosecution history of U.S. Appl. No. 15/071,247.

* cited by examiner

*Primary Examiner* — Amar Movva
(74) *Attorney, Agent, or Firm* — Ditthavong & Steiner, P.C.

(57) ABSTRACT

Methods of forming a SAV using a selective SAQP or SADP process are provided. Embodiments include providing on a TiN layer and dielectric layers alternating mandrels and non-mandrel fillers, spacers therebetween, and a metal cut plug through a mandrel or a non-mandrel filler; removing a non-mandrel filler through a SAV patterning stack having an opening over the non-mandrel filler and adjacent spacers, forming a trench; removing a mandrel through a second SAV patterning stack having an opening over the mandrel and adjacent spacers, forming a second trench; etching the trenches through the TiN and dielectric layers; forming plugs in the trenches; removing the mandrels and non-mandrel fillers, forming third trenches; etching the third trenches through the TiN layer; removing the metal cut plug and spacers and etching the third trenches into the dielectric layer; removing the plugs; and filling the trenches with metal.

20 Claims, 12 Drawing Sheets

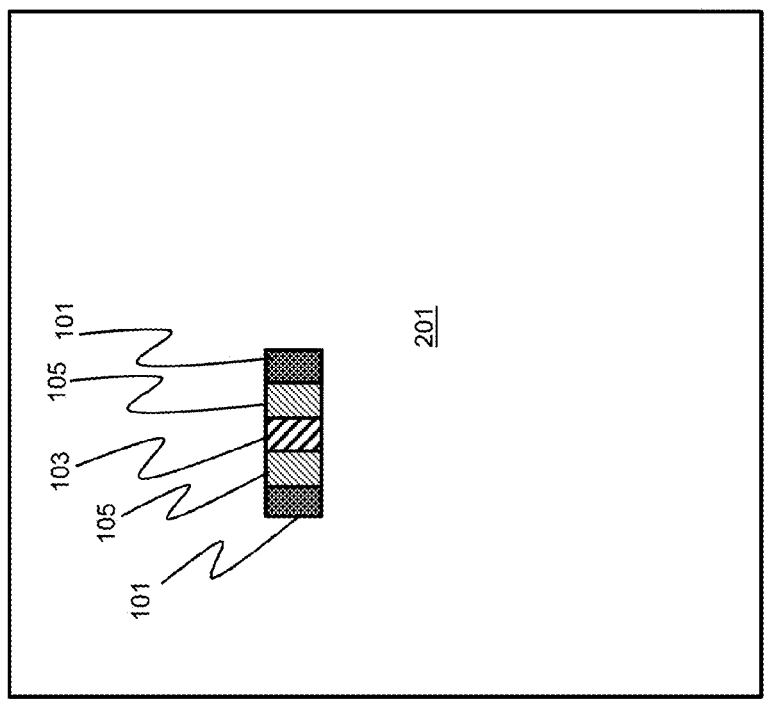
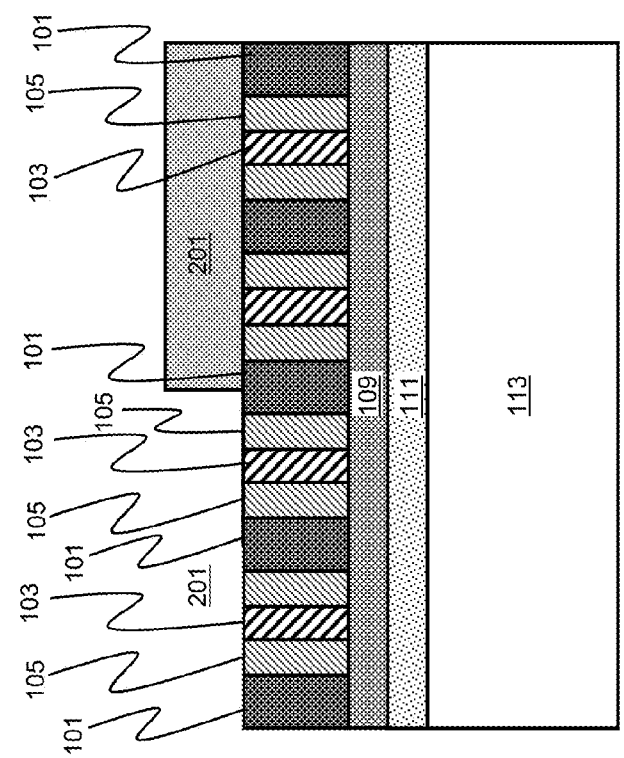
FIG. 2A
FIG. 2B

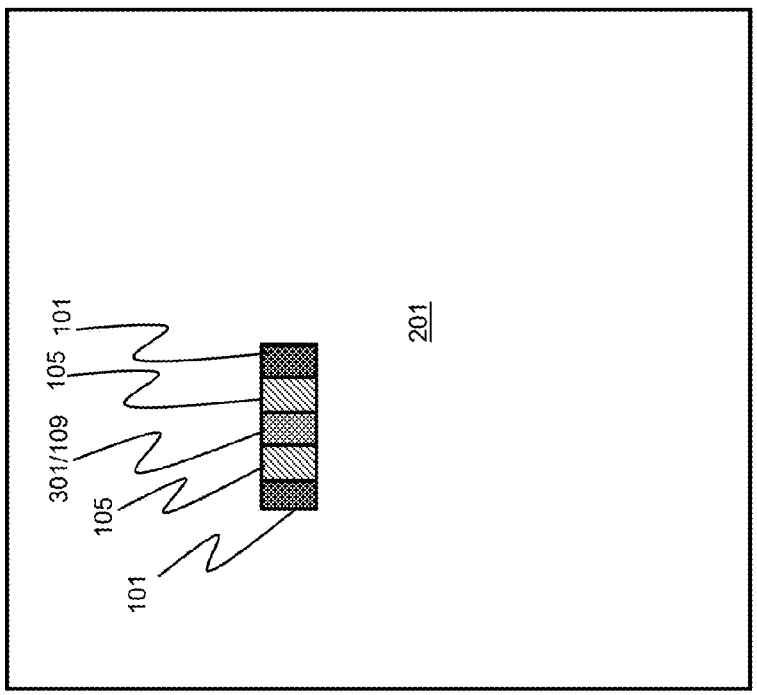
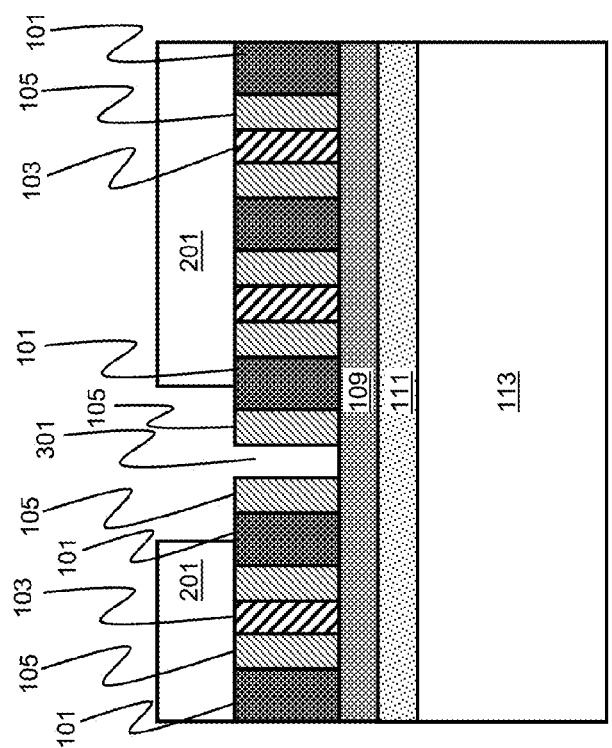
FIG. 3B
FIG. 3A

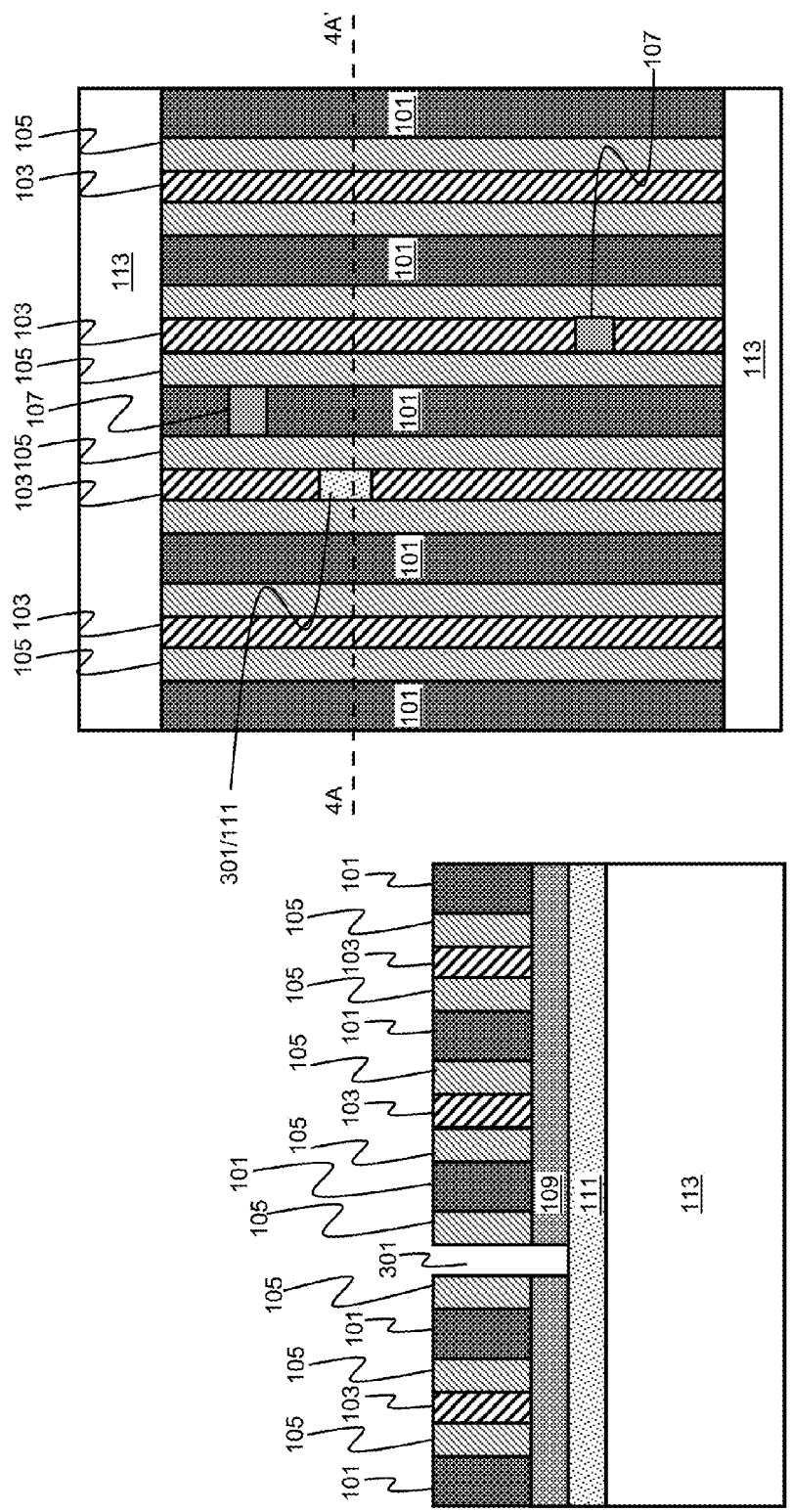

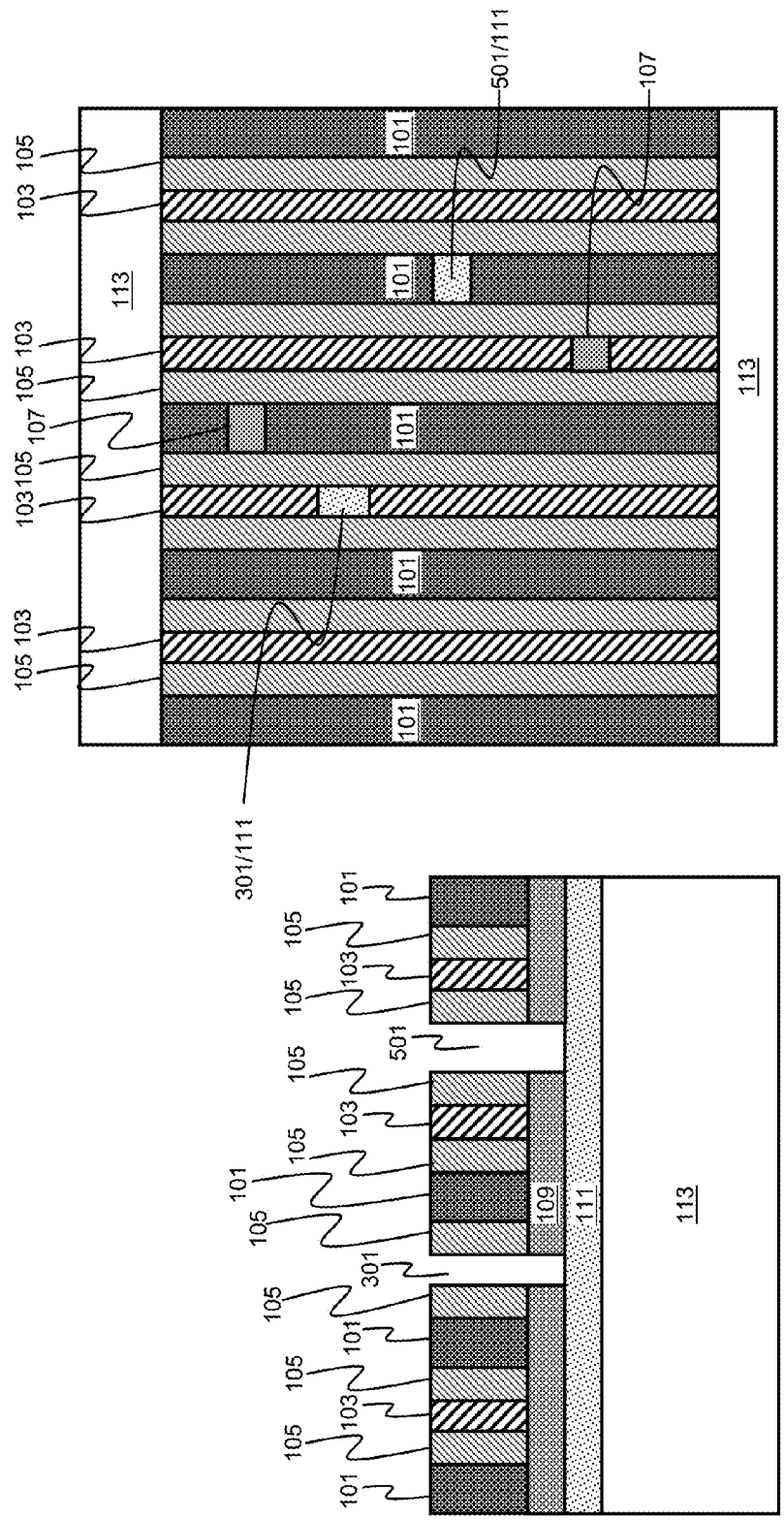

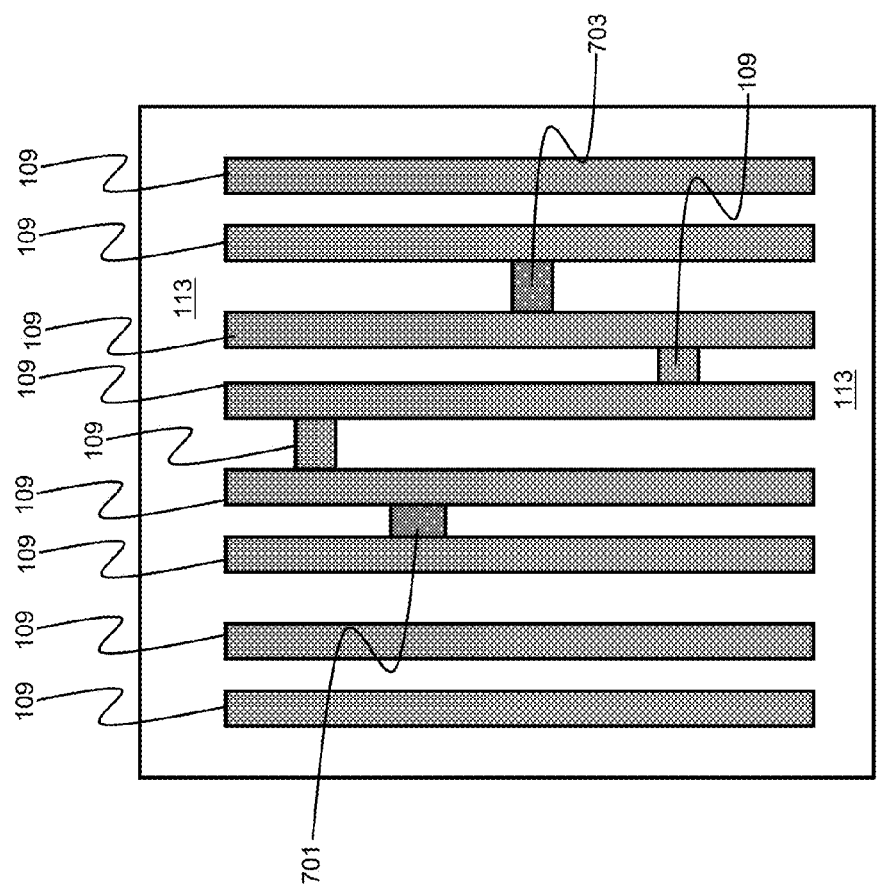
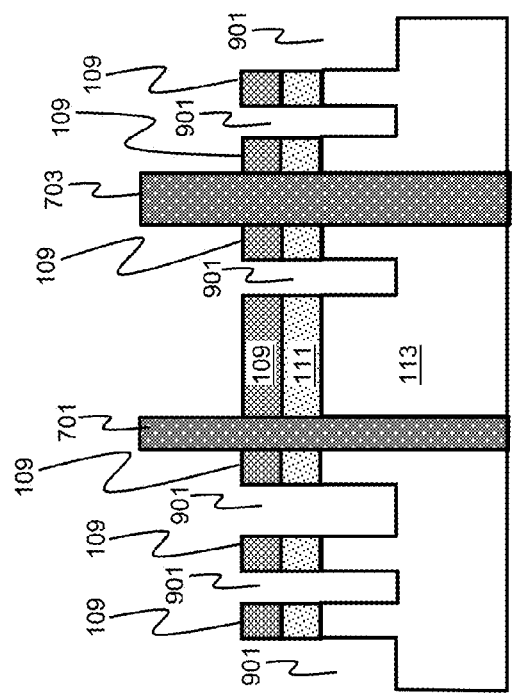
FIG. 10B
FIG. 10A

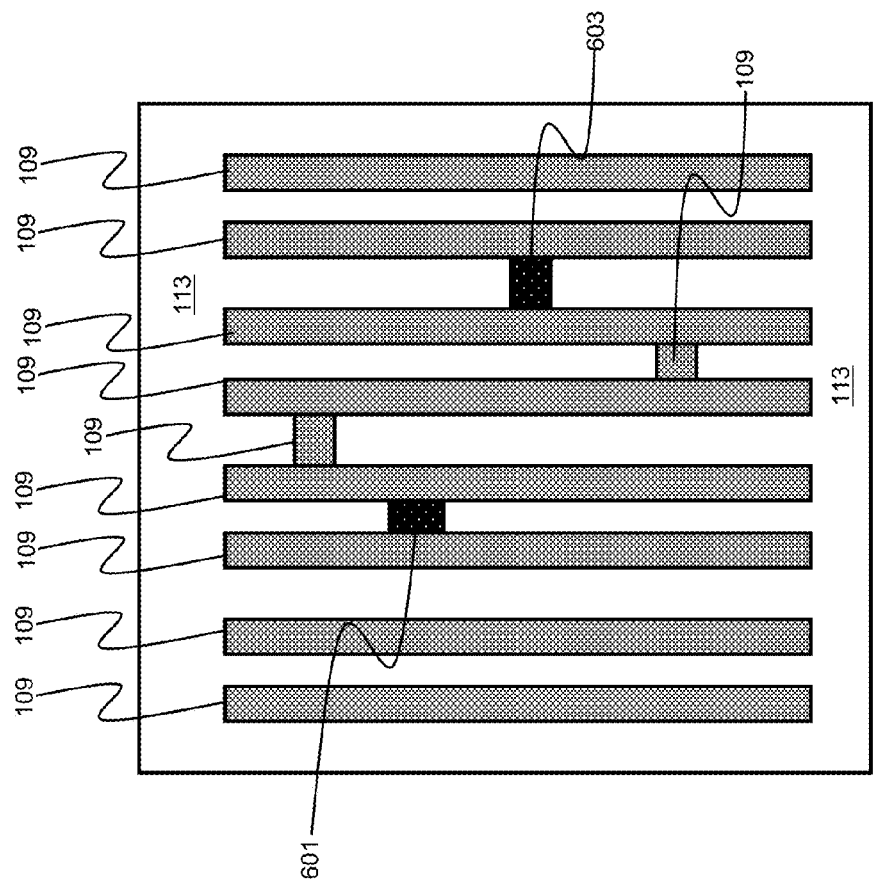
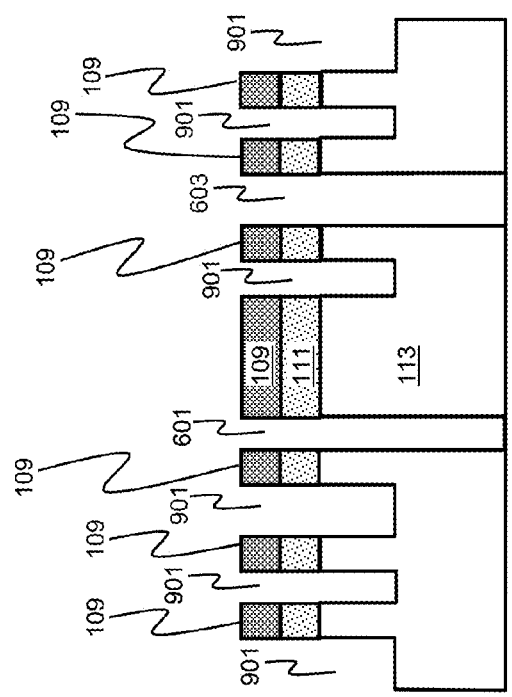
FIG. 11B
FIG. 11A

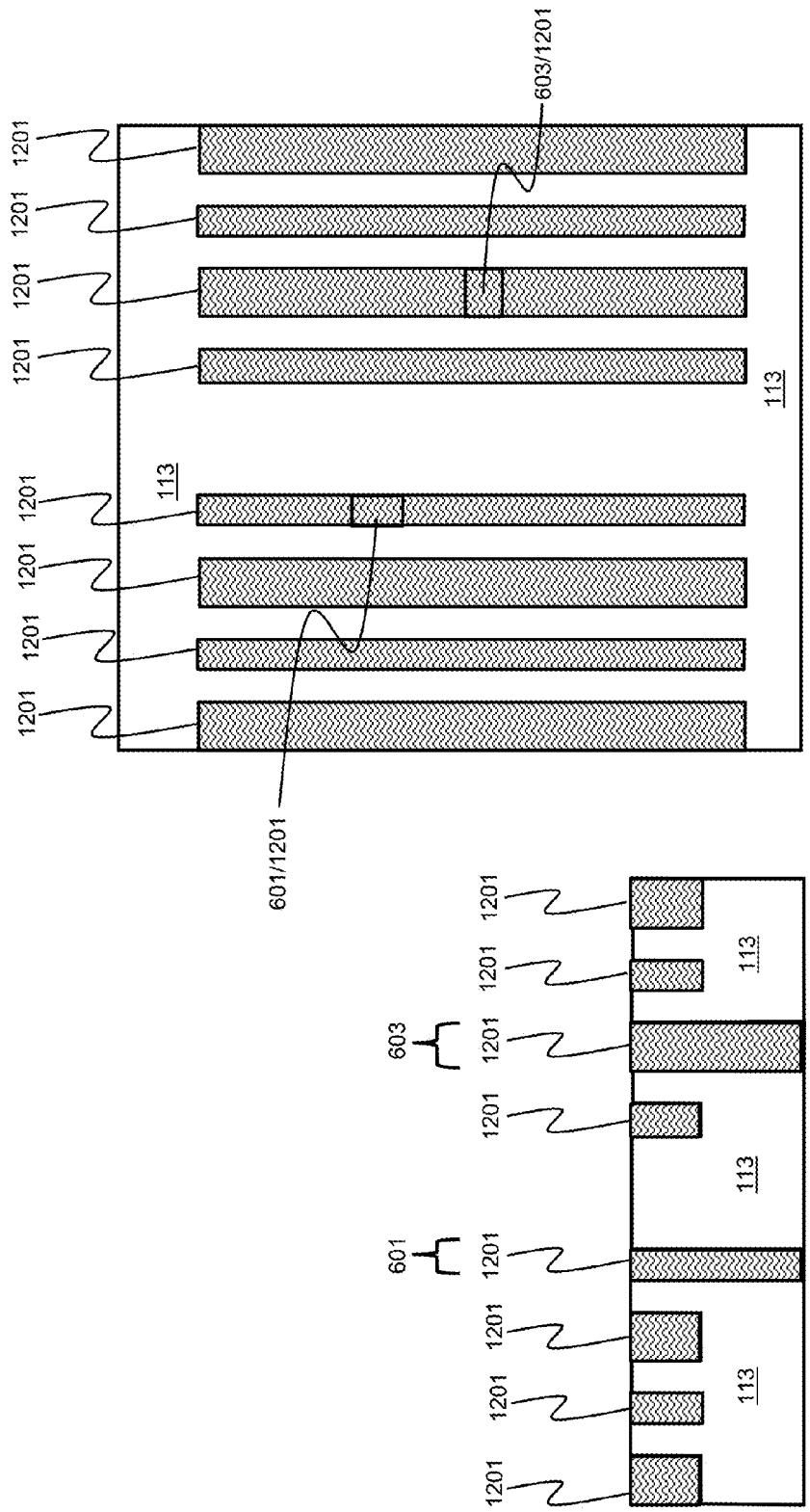

SAV USING SELECTIVE SAQP/SADP

TECHNICAL FIELD

The present disclosure relates to a method of forming a self-aligned via (SAV) in a semiconductor device. The present disclosure is particularly applicable to the 7 nanometer (nm) technology node and beyond.

BACKGROUND

With conventional lithography processes, the problem of SAV process margin loss occurs when there is shrinkage in the metal pitch. With conventional SAV processes, a metal hardmask is used to produce the SAV. However, a SAV pattern edge cannot be extended to an adjacent metal. This loss of process margin occurs when the metal pitch shrinks in the 7 nm technology node due to the limits of current lithography processes in terms of critical dimension uniformity (CDU) and overlay alignment (OVL).

A need therefore exists for methodology enabling increased process margins in terms of critical dimensions and edge placement margins during SAV formation.

SUMMARY

Aspects of the present disclosure are methods of forming a SAV using a selective self-aligned quadruple patterning (SAQP) process or a selective self-aligned double patterning (SADP) process.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing on a titanium nitride (TiN) layer and dielectric layers alternating mandrels and non-mandrel fillers, spacers therebetween, and a metal cut plug through a mandrel or a non-mandrel filler; removing a non-mandrel filler through a first SAV patterning stack having an opening over the non-mandrel filler and adjacent spacers, forming a first trench; removing a mandrel through a second SAV patterning stack having an opening over the mandrel and adjacent spacers, forming a second trench; etching the first and second trenches through the TiN and dielectric layers; forming first and second plugs in the first and second trenches; removing the mandrels and non-mandrel fillers, forming third trenches; etching the third trenches through the TiN layer; removing the metal cut plug and spacers and etching the third trenches into the dielectric layer; removing the first and second plugs; and filling the first, second and third trenches with metal.

Aspects of the present disclosure include the mandrels and the non-mandrel fillers being formed of different materials. Other aspects include the mandrels being formed of amorphous silicon (a-Si) and the non-mandrel fillers being formed of titanium oxide ($TiO_x$). Additional aspects include the opening in the first SAV stack being further over half of each adjacent mandrel and the opening in the second SAV stack being further over half of each adjacent non-mandrel filler. Further aspects include removing the first SAV stack subsequent to etching the first trench through the TiN layer and prior to forming the second SAV stack and removing the second SAV stack subsequent to etching the second trench through the TiN layer and prior to etching the first and second trenches through the dielectric layers. Another aspect includes the dielectric layers being formed of a layer of tetraethyl orthosilicate (TEOS) that is formed over an ultralow k (ULK) layer. Other aspects include the metal cut plug and spacers being formed of silicon oxide ($SiO_2$).

Another aspect of the present disclosure is method including: providing on a TiN layer and dielectric layers alternating mandrels and non-mandrel fillers, spacers therebetween, and a metal cut plug through a mandrel or a non-mandrel filler; removing a mandrel filler through a first SAV patterning stack having an opening over the mandrel and adjacent spacers, forming a first trench; etching the first trench through the TiN layer; removing a non-mandrel filler through a second SAV patterning stack having an opening over a non-mandrel filler and adjacent spacers, forming a second trench; etching the second trench through the TiN layer; etching the first and second trenches through the dielectric layers; forming first and second plugs in the first and second trenches; removing the mandrels and non-mandrel fillers, forming third trenches; etching the third trenches through the TiN layer; removing the metal cut plug and spacers and etching the third trenches into the dielectric layer; removing the first and second plugs; and filling the first, second and third trenches with metal.

Aspects include of the present disclosure include the mandrels and the non-mandrel fillers being formed of different materials. Other aspects include the mandrel being formed of a-Si and the non-mandrel being formed of $TiO_x$. Additional aspects include the opening in the first SAV stack being further over half of each adjacent mandrel and the opening in the second SAV stack being further over half of each adjacent non-mandrel filler. Further aspects include removing the first SAV stack prior to forming the second SAV stack and removing the second SAV stack prior to etching the first and second trenches through the dielectric layers. Another aspect includes the dielectric layers being formed of a layer of TEOS formed over an ULK layer. Other aspects include the metal cut plug and spacers being formed of $SiO_2$.

A further aspect of the present disclosure is method including: providing on a TiN layer and dielectric layers alternating mandrels of a-Si and non-mandrel fillers of $TiO_x$, spacers therebetween, and a metal plug through a mandrel or a non-mandrel filler; removing either a non-mandrel filler or a mandrel through a first SAV patterning stack having an opening over the non-mandrel filler or mandrel, respectively, and adjacent spacers, forming a first trench; etching the first trench through the TiN layer; removing either a mandrel or a non-mandrel filler through a second SAV patterning stack having an opening over the mandrel or the mandrel, respectively, and adjacent spacers, forming a second trench; etching the second trench through the TiN layer; etching the first and second trenches through the dielectric layers; forming first and second plugs in the first and second trenches; removing the mandrels and non-mandrel fillers, forming third trenches; etching the third trenches through the TiN layer; removing the metal cut plug and spacers and etching the third trenches into the dielectric layer; removing the first and second plugs; forming a metal layer over the dielectric and TiN layers, filling the first, second, and third trenches; and planarizing the metal layer down to the ULK layer.

Aspects include of the present disclosure include the opening in the first SAV stack being over a mandrel or a non-mandrel filler and the opening in the second SAV stack being over the other of a mandrel or a non-mandrel filler.

Other aspects include the opening in the first SAV stack being further over half of each adjacent mandrel or non-mandrel filler, respectively, and the opening in the second SAV stack being further over half of each adjacent non-mandrel filler or mandrel, respectively. Further aspects include removing the first SAV stack prior to forming the second SAV stack and removing the second SAV stack prior to etching the first and second trenches through the dielectric layers. Another aspect includes the dielectric layers being formed of a layer of TEOS formed over a ULK layer. Additional aspects include the metal cut plug and spacers being formed of $SiO_2$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B through 12A and 12B, respectively, schematically illustrate a cross-sectional view and a top view of a process flow for forming a SAV using a selective SAQP or SADP process, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of process margin loss attendant upon SAV formation when there is shrinkage in the metal pitch. The present disclosure solves such problem by taking advantage of the etch selectivity between different mandrel and non-mandrel filler materials.

Methodology in accordance with embodiments of the present disclosure includes providing on a TiN layer and dielectric layers alternating mandrels and non-mandrel fillers, spacers therebetween, and a metal cut plug through a mandrel or a non-mandrel filler. A non-mandrel filler is removed through a first SAV patterning stack having an opening over the non-mandrel filler and adjacent spacers, forming a first trench. A mandrel is then removed through a second SAV patterning stack having an opening over the mandrel and adjacent spacers, forming a second trench. The first and second trenches are etched through the TiN and dielectric layers, and first and second plugs are formed in the first and second trenches. The mandrels and non-mandrel fillers are then removed, forming third trenches. The third trenches are etched through the TiN layer, and the metal cut plug and spacers are removed. The third trenches are etched into the dielectric layer, and the first and second plugs are removed. The first, second, and third trenches are then filled with metal.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
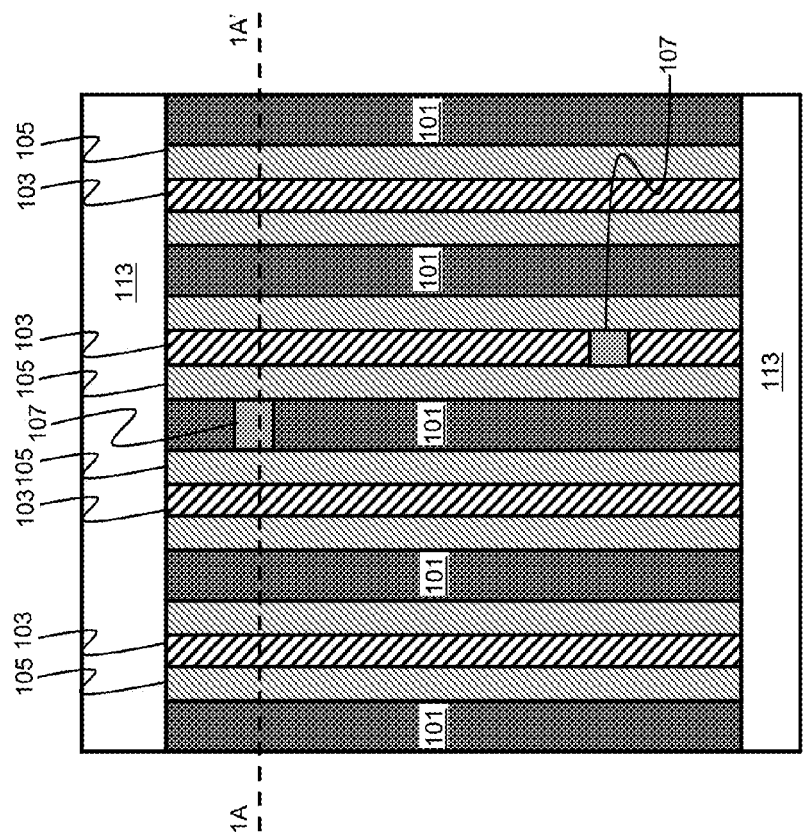
Figure 1A:
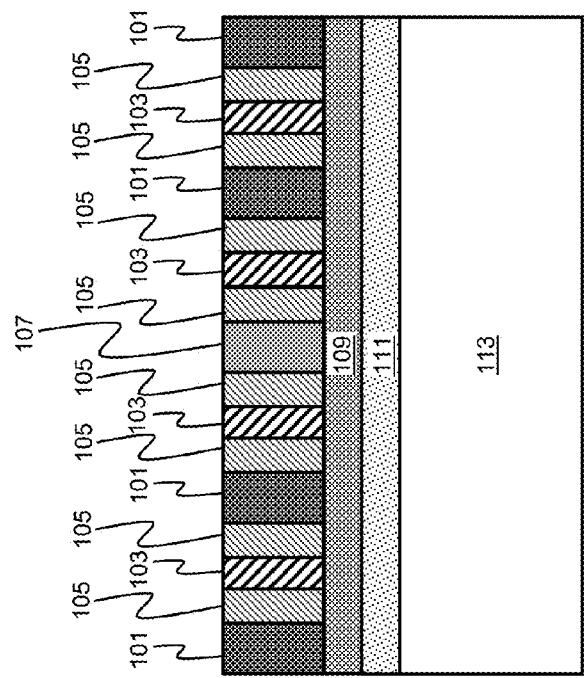

FIGS. 1A and 1B through 12A and 12B, respectively, schematically illustrate a cross-sectional view and a top view of a process flow for forming a SAV using a selective SAQP or SADP process, in accordance with an exemplary embodiment. Specifically, FIG. 1A illustrates a cross-sectional view along lines 1A-1A'. Adverting to FIGS. 1A and 1B, alternating mandrels 101 and non-mandrel fillers 103 with spacers 105 therebetween and a metal cut plug 107 through a mandrel 101 or a non-mandrel filler 103 are formed over a TiN layer 109 and dielectric layers 111 and 113, e.g., TEOS and ULK, respectively. The mandrels 101 and the non-mandrel fillers 103 are formed of materials having different etch selectivity. For example, the mandrel 101 may be formed of a-Si, and the non-mandrel filler may be formed of $TiO_x$. The spacers 105 and the metal cut plugs 107 may be formed, for example, of $SiO_2$.

A SAV patterning stack 201, having an opening at least over a non-mandrel filler 103 and adjacent spacers 105, is formed over the mandrels 101, non-mandrel fillers 103, spacers 105, and metal cut plugs 107, as depicted in FIGS. 2A and 2B. As illustrated, the opening in the SAV pattern stack 201 may extend over half of each adjacent mandrel 101, but the opening may be as wide as the next adjacent spacers 105. In other words, the edge of the SAV pattern stack 201 should not touch the material to be etched, e.g., the non-mandrel filler 103, and should not expose the material to be protected, e.g., the next non-mandrel fillers 103 in the series. Adverting to FIGS. 3A and 3B, the non-mandrel filler 103 in the opening is removed, e.g., by etching with chlorine ($Cl_2$) or fluorine ($F_2$), forming the trench 301. The trench 301 is then etched through the TiN layer 109, e.g., using $Cl_2$ plus ethylene ($C_2H_4$), and the SAV patterning stack 201 is removed, as depicted in FIGS. 4A and 4B. FIG. 4A illustrates a cross-sectional view along lines 4A-4A'.

A mandrel 101 is then removed through a second SAV patterning stack (not shown for illustrative convenience) having an opening over the mandrel 101 and adjacent spacers 105, forming the trench 501, as depicted in FIGS. 5A and 5B. Trenches 301 and 501 (and the resulting vias) are aligned as shown in FIGS. 5B through 12B, not horizontally aligned, but are illustrated as horizontally aligned in the cross-sectional views 5A through 12A for illustrative convenience in showing the various steps. The opening in the second SAV patterning stack 201 is over half of each adjacent non-mandrel filler 103 and the opening may be as wide as the next adjacent spacers 105. The mandrel 101 may be removed, for example, by $Cl_2$, $F_2$, or $SF_6$. The trench 501 is then etched through the TiN layer 109, e.g., using $CL_2$+ $C_2H_4$, and the second SAV patterning stack is removed.

Alternatively, the order of the mandrels 101 and the non-mandrel fillers 103 may be switched, and the SAV patterning stack 201 may be formed with an opening over a mandrel 101 and adjacent spacers 105. In this embodiment, the mandrel 101 would be removed, e.g., by etching with $Cl_2$, $F_2$, or $SF_6$. Then, the second SAV patterning stack would be formed over a non-mandrel 103 and adjacent spacers 105, and the non-mandrel 103 would be removed.

Figure 6B:
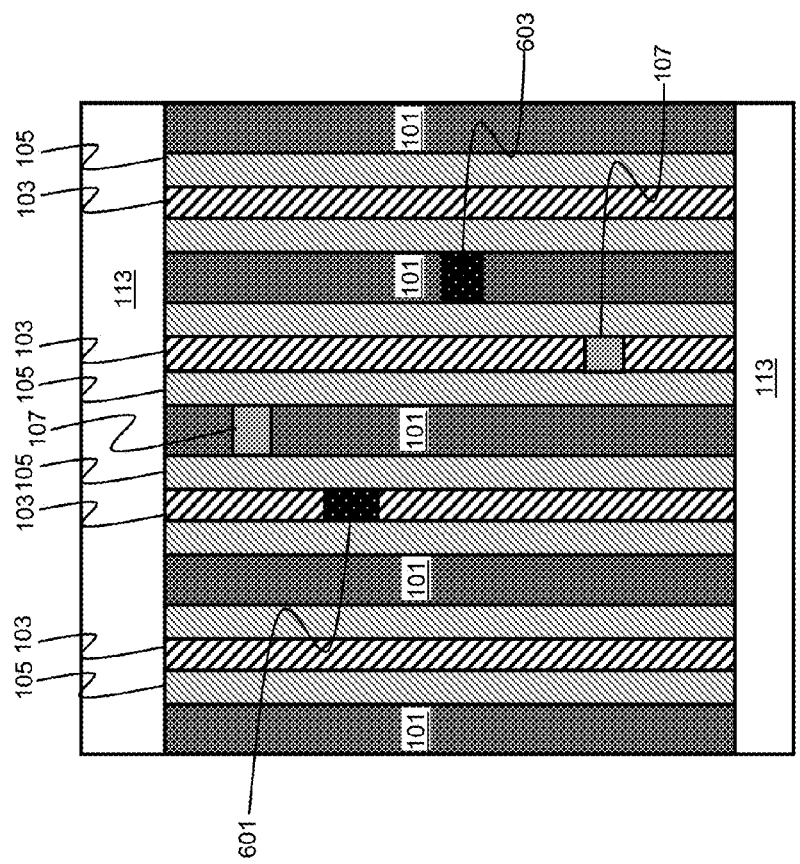
Figure 6A:
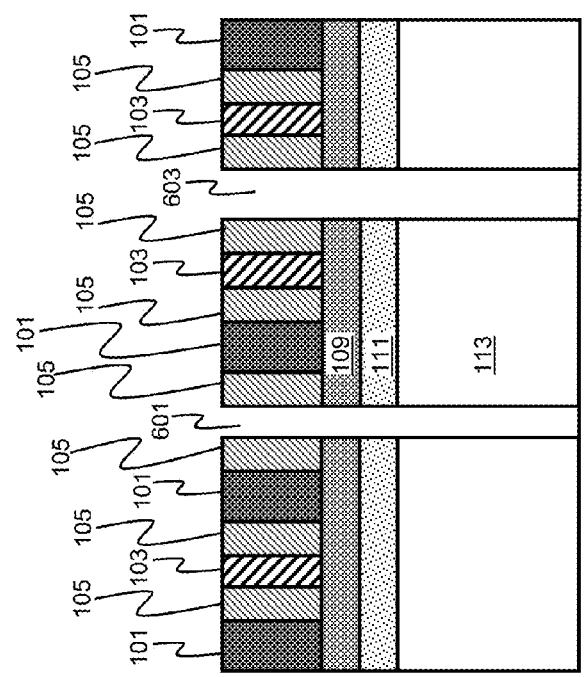
Figures 7A, 7B:
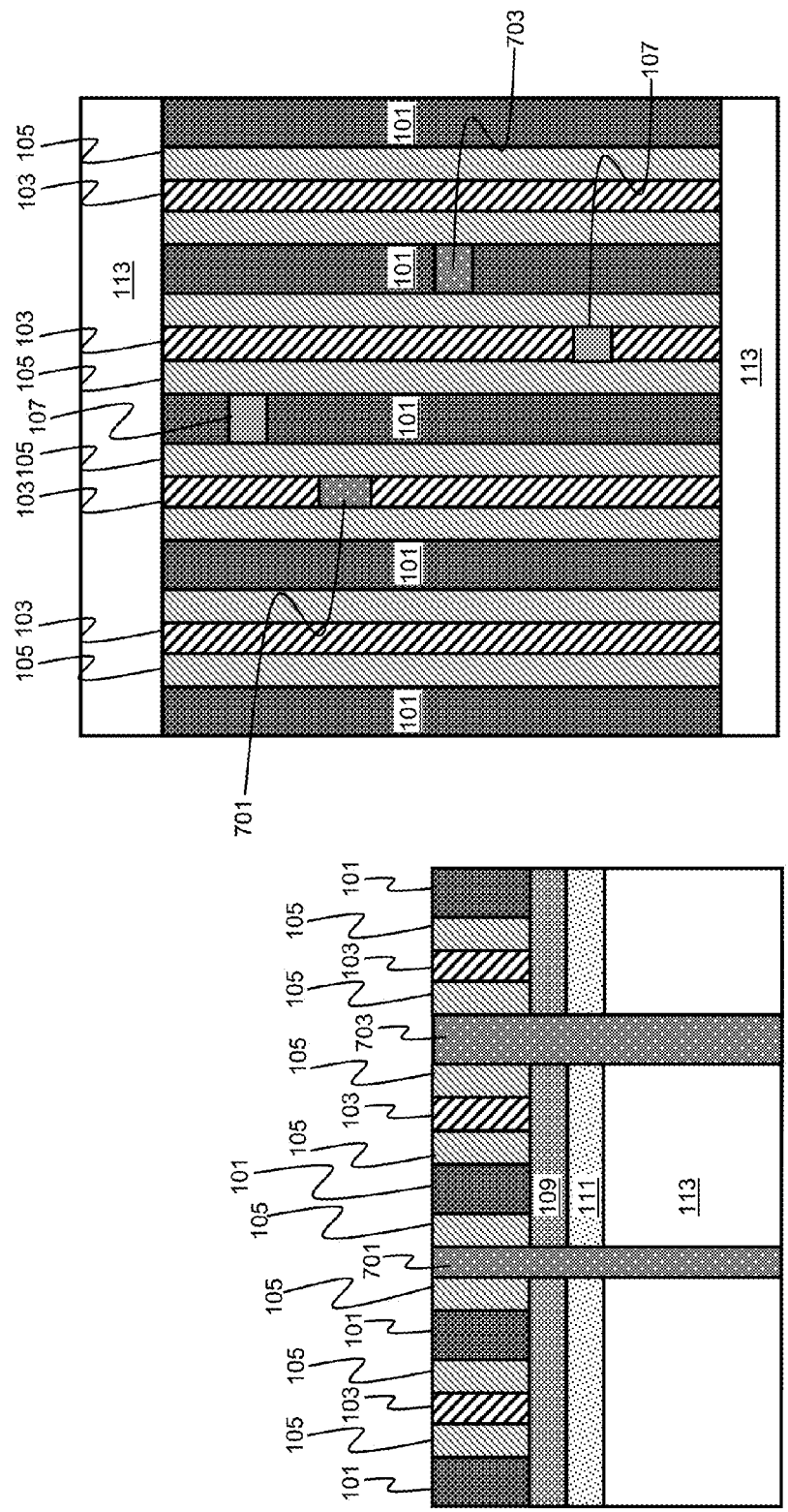
Figure 8B:
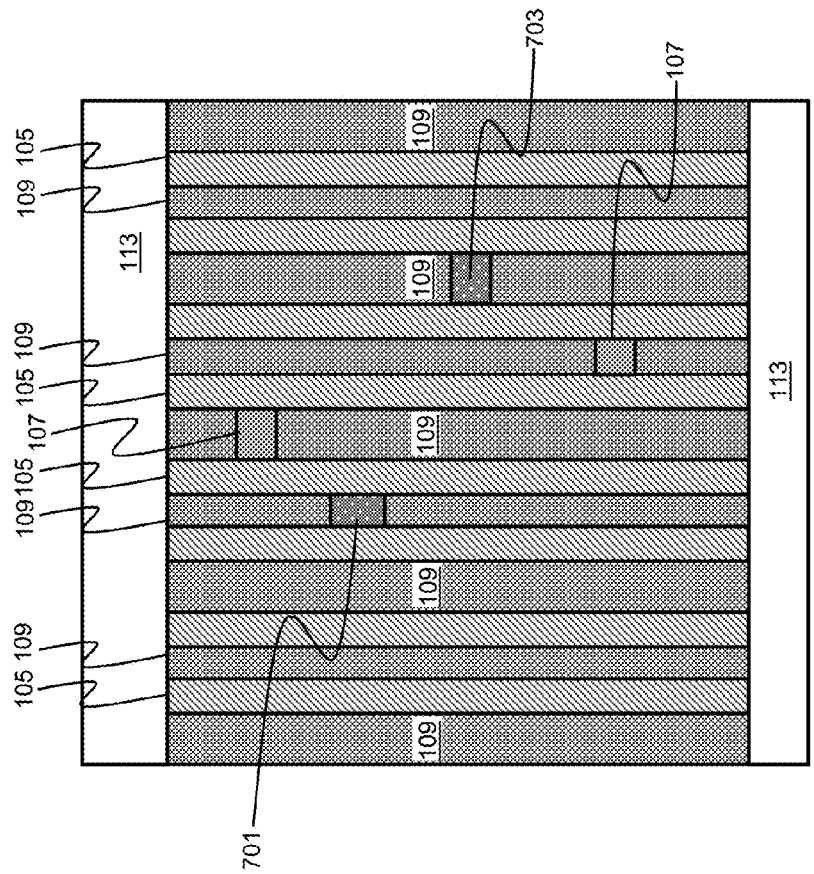
Figure 8A:
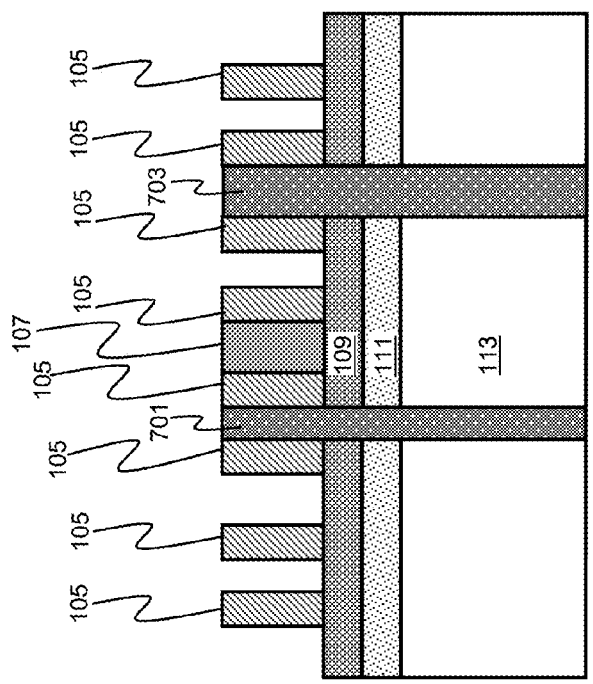

Adverting to FIGS. 6A and 6B, vias 601 and 603 are formed by etching trenches 301 and 501, respectively, through the TEOS layer 111 and the ULK layer 113, for example, by using fluoroform ($CHF_3$). Plugs 701 and 703 are then formed, e.g., of an organic planarization material such as ODL201 (Shin-Etsu Chemical Co., Ltd.), in the vias 601 and 603, as depicted in FIGS. 7A and 7B. The plugs 701 and 703 are not actually horizontally aligned, as shown in the top view, but both are shown in the cross-sectional view for illustrative convenience in showing the various steps. Adverting to FIGS. 8A and 8B, the mandrels 101 and the non-mandrel fillers 103 are removed, e.g., with $Cl_2$, $F_2$, or $SF_6$ and $Cl_2$ or $F_2$, respectively. The metal cut plugs 107 and the plugs 701 and 703 are also not actually horizontally aligned, as shown in the top view, but one of the metal cut plugs 107 is shown in the cross-sectional view along with the plugs 701 and 703 to illustrate how the metal cut plugs 107 behave during subsequent method steps, e.g., etching.

Figure 9B:
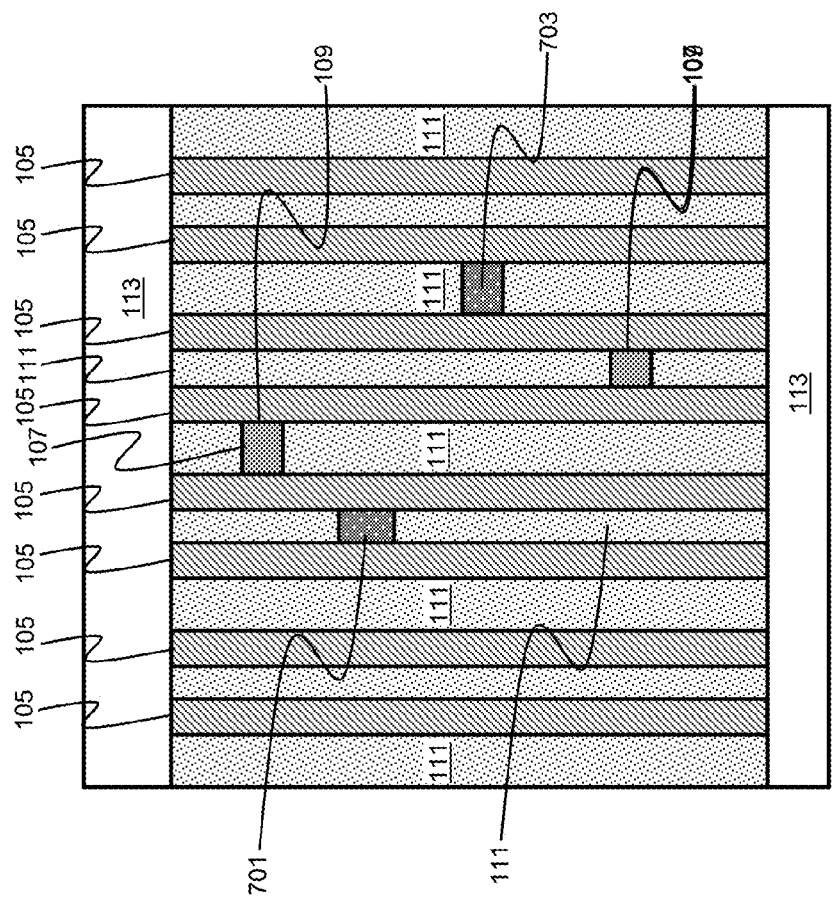
Figure 9A:
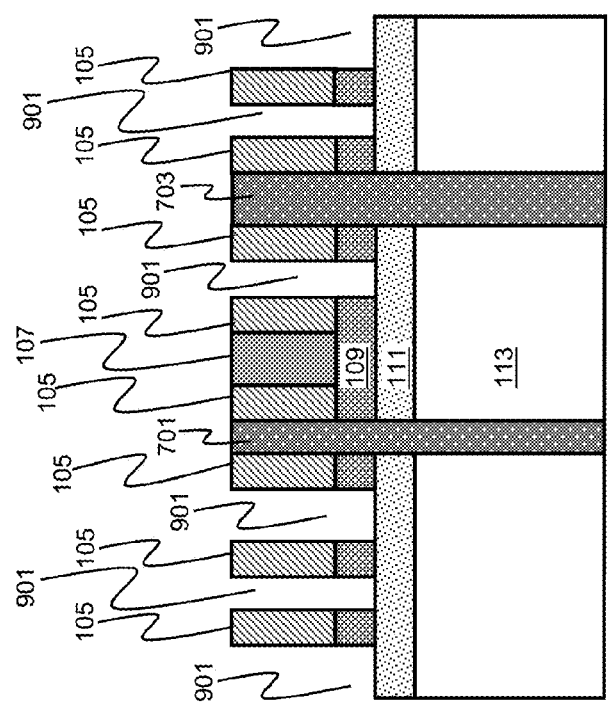

Trenches 901 are then formed through the TiN layer 109, as depicted in FIGS. 9A and 9B. The trenches 901 may be formed, e.g., by etching the TiN layer 109 with $Cl_2+C_2H_4$. Again, the metal cut plugs 107 and the plugs 701 and 703 are not actually horizontally aligned, but both are shown in the cross-section view for illustrative convenience. Adverting to FIGS. 10A and 10B, the metal cut plug 107 and the spacers 105 are removed and the TEOS and ULK layers 111 and 113, respectively, are etched through the trenches 901. The metal cut plugs 107, the spacers 105, the TEOS and ULK layers 111 and 113, respectively, may all be removed, for example, using the same etchant. A portion of the plugs 701 and 703 may be removed during the removal of metal cut plugs 107, etc. However, as long as the upper surface of the plugs 701 and 703 is above the TEOS layer 113 after the metal cut plugs 107, the spacers 105, the TEOS and ULK layers 111 and 113, respectively, are removed, the remaining height of the plugs 701 and 703 is not significant, as the via bottoms will still be protected from are etch.

Adverting to FIGS. 11A and 11B, the plugs 701 and 703 are removed, reopening vias 601 and 301, respectively. Because the plugs 701 and 703 are formed of an organic material, e.g., ODL210, they may be removed, for example, with an oxygen plasma etch or diazene ($N_2H_2$). A thin barrier layer and a liner (both not shown for illustrative convenience) are then formed over the TiN layer 109 and in the holes 901, 601, and 603. Thereafter, a metal layer 1201, e.g., copper, is formed in the trenches 901, 601, and 603, as depicted in FIGS. 12A and 12B. The metal layer 1201 may be blanket deposited over the barrier layer and in the trenches 901, 601, and 603 and then planarized, e.g., by chemical mechanical polishing (CMP), down to the ULK layer 113.

The embodiments of the present disclosure can achieve several technical effects, including improved block or cut process margin in SAV formation. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 7 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method of comprising:
   providing on a titanium nitride (TiN) layer and dielectric layers alternating mandrels and non-mandrel fillers, spacers therebetween, and a metal cut plug through a mandrel or a non-mandrel filler;
   removing a non-mandrel filler through a first self-aligned via (SAV) patterning stack having an opening over the non-mandrel filler and adjacent spacers, forming a first trench;
   removing a mandrel through a second SAV patterning stack having an opening over the mandrel and adjacent spacers, forming a second trench;
   etching the first and second trenches through the TiN and dielectric layers;
   forming first and second plugs in the first and second trenches;
   removing the mandrels and non-mandrel fillers, forming third trenches;
   etching the third trenches through the TiN layer;
   removing the metal cut plug and spacers and etching the third trenches into the dielectric layer;
   removing the first and second plugs; and
   filling the first, second and third trenches with metal.

2. The method according to claim 1, wherein the mandrels and the non-mandrel fillers comprise different materials.

3. The method according to claim 2, wherein the mandrels comprise amorphous silicon (a-Si) and the non-mandrel fillers comprise titanium oxide ($TiO_x$).

4. The method according to claim 1, wherein the opening in the first SAV stack is further over half of each adjacent mandrel and the opening in the second SAV stack is further over half of each adjacent non-mandrel filler.

5. The method according to claim 1, comprising:
   removing the first SAV stack subsequent to etching the first trench through the TiN layer and prior to forming the second SAV stack; and
   removing the second SAV stack subsequent to etching the second trench through the TiN layer and prior to etching the first and second trenches through the dielectric layers.

6. The method according to claim 1, wherein the dielectric layers comprise a layer of tetraethyl orthosilicate (TEOS) formed over an ultra-low k (ULK) layer.

7. The method according to claim 1, wherein the metal cut plug and spacers comprise silicon oxide ($SiO_2$).

8. A method of comprising:
   providing on a titanium nitride (TiN) layer and dielectric layers alternating mandrels and non-mandrel fillers, spacers therebetween, and a metal cut plug through a mandrel or a non-mandrel filler;

removing a mandrel filler through a first self-aligned via (SAV) patterning stack having an opening over the mandrel and adjacent spacers, forming a first trench;
etching the first trench through the TiN layer;
removing a non-mandrel filler through a second SAV patterning stack having an opening over a non-mandrel filler and adjacent spacers, forming a second trench;
etching the second trench through the TiN layer;
etching the first and second trenches through the dielectric layers;
forming first and second plugs in the first and second trenches;
removing the mandrels and non-mandrel fillers, forming third trenches;
etching the third trenches through the TiN layer;
removing the metal cut plug and spacers and etching the third trenches into the dielectric layer;
removing the first and second plugs; and
filling the first, second and third trenches with metal.

9. The method according to claim 8, wherein the mandrels and the non-mandrel fillers comprise different materials.

10. The method according to claim 9, wherein the mandrel comprises amorphous silicon (a-Si) and the non-mandrel comprises titanium oxide (TiO$_x$).

11. The method according to claim 8, wherein the opening in the first SAV stack is further over half of each adjacent mandrel and the opening in the second SAV stack is further over half of each adjacent non-mandrel filler.

12. The method according to claim 8, comprising:
removing the first SAV stack prior to forming the second SAV stack; and
removing the second SAV stack prior to etching the first and second trenches through the dielectric layers.

13. The method according to claim 8, wherein the dielectric layers comprise a layer of tetraethyl orthosilicate (TEOS) formed over an ultra-low k (ULK) layer.

14. The method according to claim 8, wherein the metal cut plug and spacers comprise silicon oxide (SiO$_2$).

15. A method comprising:
providing on a titanium nitride (TiN) layer and dielectric layers alternating mandrels of amorphous silicon (a-Si) and non-mandrel fillers of titanium oxide (TiO$_x$), spacers therebetween, and a metal plug through a mandrel or a non-mandrel filler;
removing either a non-mandrel filler or a mandrel through a first self-aligned (SAV) patterning stack having an opening over the non-mandrel filler or mandrel, respectively, and adjacent spacers, forming a first trench;
etching the first trench through the TiN layer;
removing either a mandrel or a non-mandrel filler through a second SAV patterning stack having an opening over the mandrel or the mandrel, respectively, and adjacent spacers, forming a second trench;
etching the second trench through the TiN layer;
etching the first and second trenches through the dielectric layers;
forming first and second plugs in the first and second trenches;
removing the mandrels and non-mandrel fillers, forming third trenches;
etching the third trenches through the TiN layer;
removing the metal cut plug and spacers and etching the third trenches into the dielectric layer;
removing the first and second plugs;
forming a metal layer over the dielectric and TiN layers, filling the first, second, and third trenches; and
planarizing the metal layer down to the TiN layer.

16. The method according to claim 15, wherein the opening in the first SAV stack is over a mandrel or a non-mandrel filler and the opening in the second SAV stack is over the other of a mandrel or a non-mandrel filler.

17. The method according to claim 15, wherein the opening in the first SAV stack is further over half of each adjacent mandrel or non-mandrel filler, respectively, and the opening in the second SAV stack is further over half of each adjacent non-mandrel filler or mandrel, respectively.

18. The method according to claim 15, comprising:
removing the first SAV stack prior to forming the second SAV stack; and
removing the second SAV stack prior to etching the first and second trenches through the dielectric layers.

19. The method according to claim 15, wherein the dielectric layers comprise a layer of tetraethyl orthosilicate (TEOS) formed over an ultra-low k (ULK) layer.

20. The method according to claim 15, wherein the metal cut plug and spacers comprise silicon oxide (SiO$_2$).

* * * * *